US007613062B2

(12) United States Patent
Nakano et al.

(10) Patent No.: US 7,613,062 B2
(45) Date of Patent: Nov. 3, 2009

(54) SEMICONDUCTOR MEMORY DEVICE IN WHICH DATA IS STORED IN NONVOLATILE STATE, BY USING SEMICONDUCTOR ELEMENTS OF METAL OXIDE SEMICONDUCTOR (MOS) STRUCTURE

(75) Inventors: Hiroaki Nakano, Yokohama (JP); Toshimasa Namekawa, Tokyo (JP); Hiroshi Ito, Yokohama (JP); Osamu Wada, Yokohama (JP); Atsushi Nakayama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 31 days.

(21) Appl. No.: 11/738,774

(22) Filed: Apr. 23, 2007

(65) Prior Publication Data
US 2008/0002504 A1 Jan. 3, 2008

(30) Foreign Application Priority Data
Jul. 3, 2006 (JP) ............................. 2006-183712

(51) Int. Cl.
*G11C 17/18* (2006.01)
(52) U.S. Cl. .............................. 365/225.7; 365/189.19; 365/96
(58) Field of Classification Search ............... 365/225.7, 365/189.19, 96
See application file for complete search history.

(56) References Cited

U.S. PATENT DOCUMENTS

2004/0155315 A1* 8/2004 Marr et al. ................... 257/530
2006/0114020 A1* 6/2006 Taheri et al. .................. 326/37
2006/0133127 A1 6/2006 Nakano et al.
2006/0285393 A1* 12/2006 Paillet et al. ............ 365/185.28
2008/0117660 A1* 5/2008 Xu et al. ........................ 365/96

OTHER PUBLICATIONS

Allen et al., CMOS Analog Circuit Design, 1987, Holt, Rihehart and Winston Inc., pp. 97-99.*
U.S. Appl. No. 11/968,893, filed Jan. 3, 2008, Namekawa.
U.S. Appl. No. 11/971,425, filed Jan. 9, 2008, Matsufuji, et al.
Hiroshi Ito, et al., "Pure CMOS One-time Programmable Memory using Gate-Ox Anti-fuse", Proceedings of the IEEE 2004, Custom Integrated Circuits Conference, 4 Pages.
U.S. Appl. No. 11/833,054, filed Aug. 2, 2007, Namekawa, et al.
U.S. Appl. No. 11/839,199, filed Aug. 15, 2007, Matsufuji, et al.
U.S. Appl. No. 12/140,071, filed Jun. 16, 2008, Matsufuji et al.

* cited by examiner

*Primary Examiner*—Hoai V Ho
*Assistant Examiner*—Fernando N Hidalgo
(74) *Attorney, Agent, or Firm*—Oblon, Spivak, McClelland, Maier & Neustadt, L.L.P.

(57) ABSTRACT

A semiconductor memory device includes a memory element, a first data line and a second data line, a first selection transistor, and a second selection transistor. The memory element includes a semiconductor element of MOS structure in which data is programmed when an insulating film provided in the semiconductor element is broken down by application of a voltage thereto. The first and second data lines are connected to a sense amplifier. The first selection transistor is configured to connect the memory element to the first data line in order to program data in the memory element. The second selection transistor is configured to connect the memory element to the second data line in order to program data in the memory element and detect the data programmed in the memory element. The second selection transistor has a smaller gate-electrode width smaller than the first selection transistor.

12 Claims, 7 Drawing Sheets

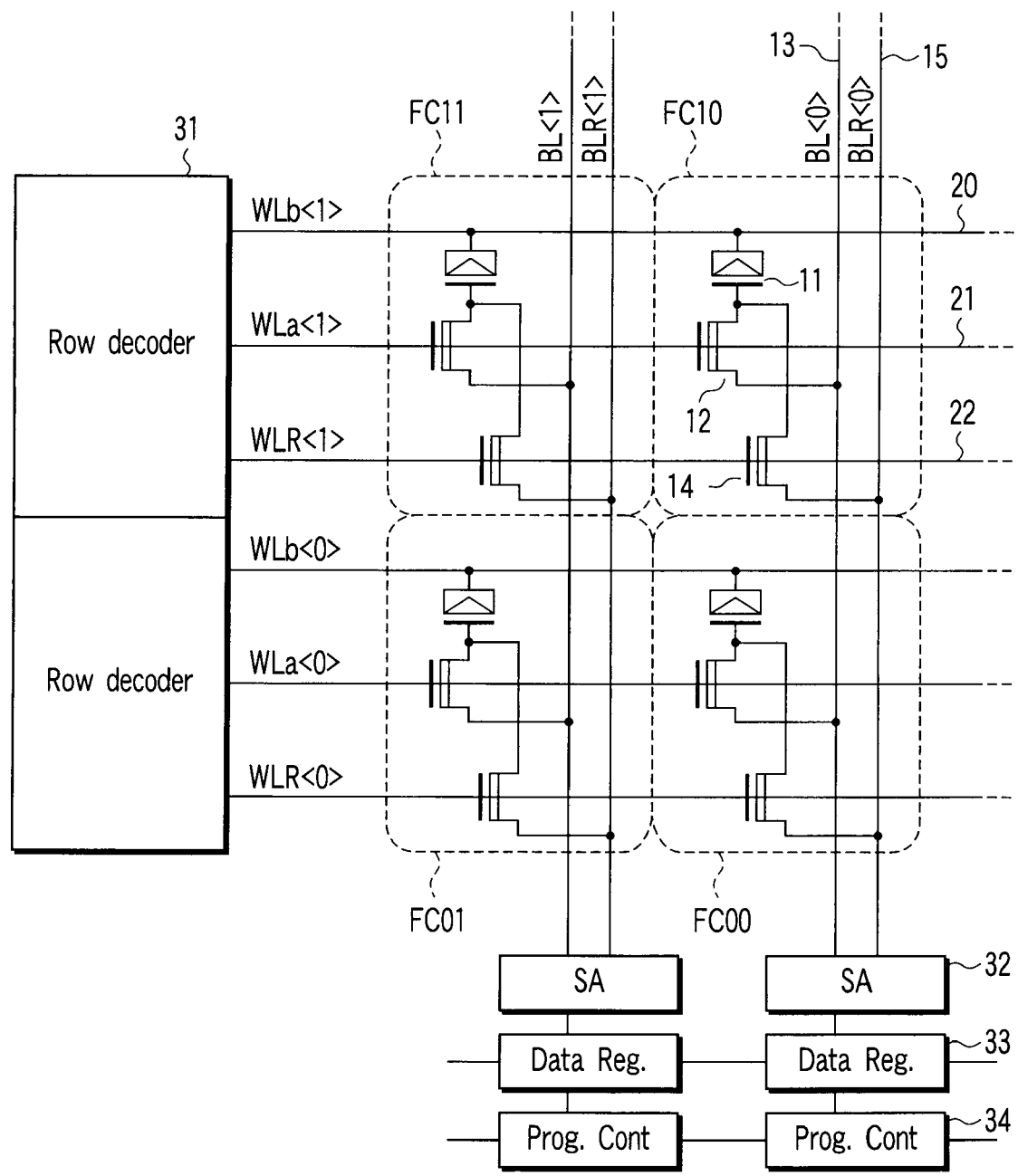
F I G. 1

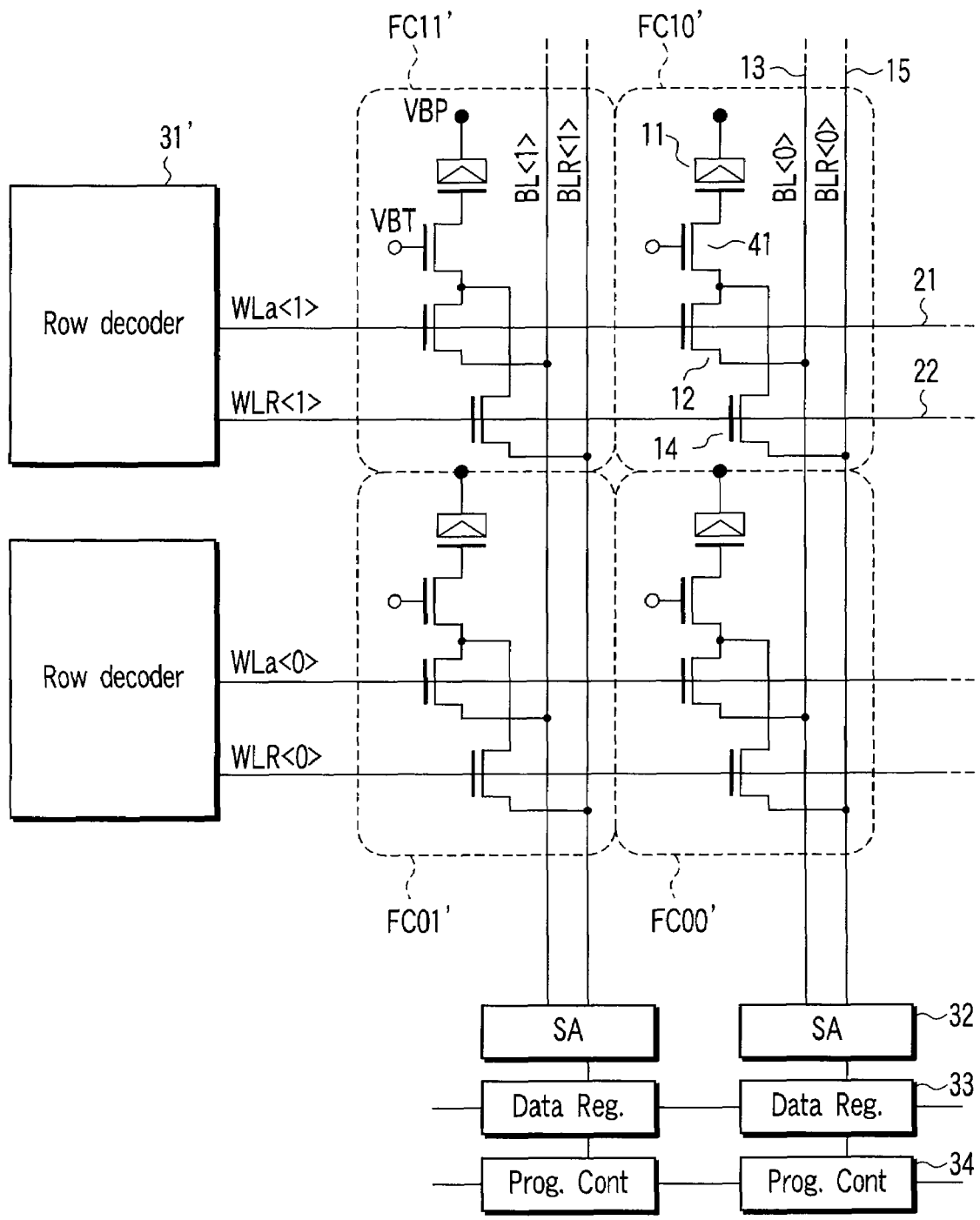
F I G. 5

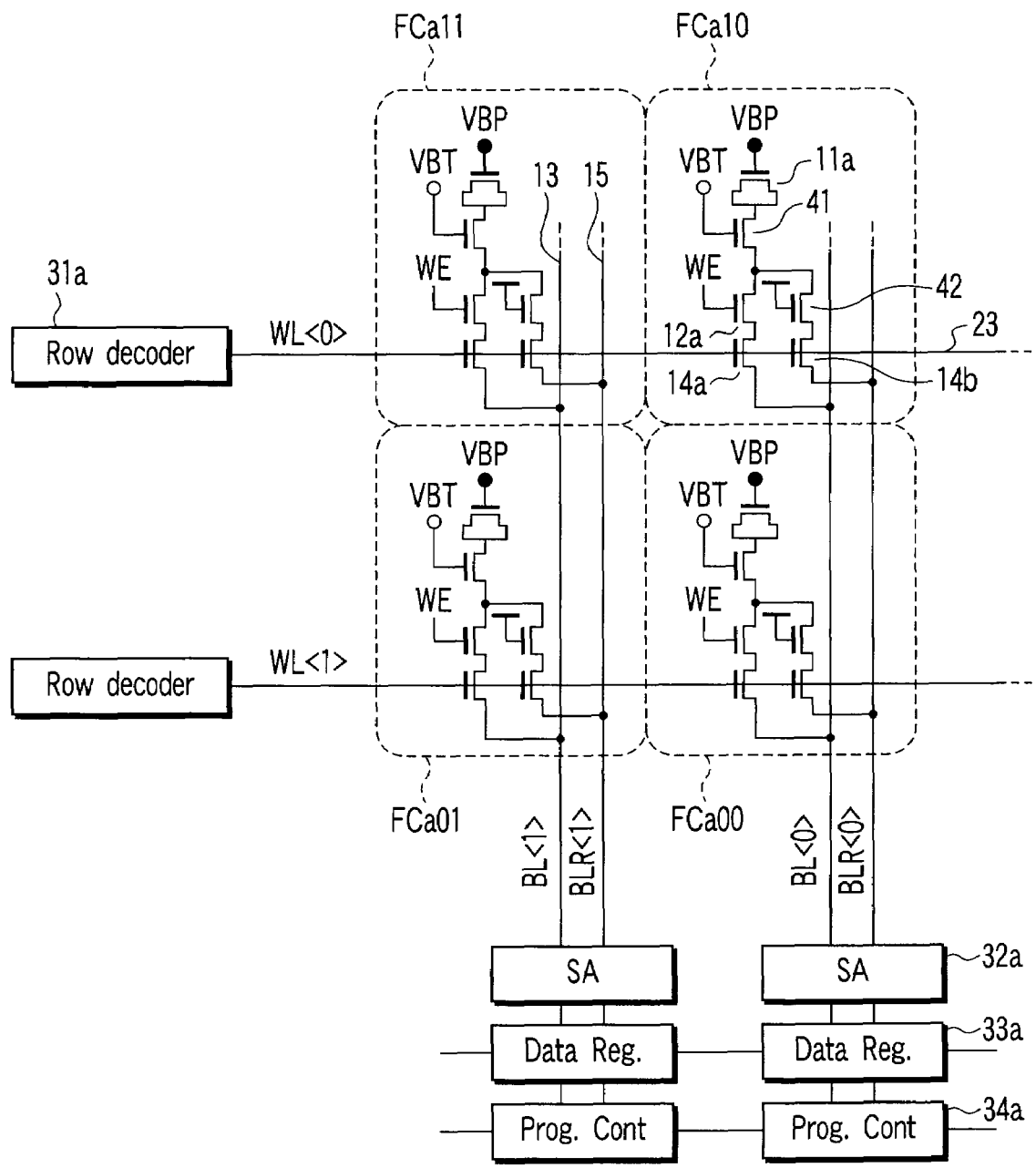
F I G. 6

SEMICONDUCTOR MEMORY DEVICE IN WHICH DATA IS STORED IN NONVOLATILE STATE, BY USING SEMICONDUCTOR ELEMENTS OF METAL OXIDE SEMICONDUCTOR (MOS) STRUCTURE

CROSS-REFERENCE TO RELATED APPLICATIONS

This application is based upon and claims the benefit of priority from prior Japanese Patent Application No. 2006-183712, filed Jul. 3, 2006, the entire contents of which are incorporated herein by reference.

BACKGROUND OF THE INVENTION

1. Field of the Invention

The present invention relates to a semiconductor memory device. More particularly, the invention relates to a nonvolatile semiconductor memory device of insulating-film breakdown type, in which high voltage is applied to the semiconductor elements of MOS structure, breaking down the insulating film in each element, thereby to store data in nonvolatile state.

2. Description of the Related Art

In recent years, nonvolatile semiconductor memory devices have been proposed, in which semiconductor memory elements of insulating-film breakdown type (hereinafter called e-Fuse elements) are used as memory elements. An e-Fuse element is a semiconductor element of MOS structure. Its insulating film is broken down when it is applied with a high voltage that exceeds the maximum rated value, whereby the element stores data in nonvolatile state. Thus, a nonvolatile semiconductor memory device having e-Fuse elements used as memory elements store data when the characteristics of the e-Fuse elements are irreversibly changed. By nature, this memory device can be programmed only once to store data. This is why this nonvolatile semiconductor memory device is called one-time programmable (OTP) memory. In the OTP memory, each e-Fuse element stores data "0" before its insulating film is broken down. Once the insulating film has been broken down, the e-Fuse element stores data "1," which may be utilized.

The OTP memory described above is expected to find use in the future in various fields, such as redundancy technology for dynamic random access memories (DRAMs), tuning of analog circuits, storage of codes such as encryption keys, and storage of chip identification data (ID).

In the conventional OTP memory, each memory cell, i.e., data storage unit, comprises, for example, an e-Fuse element, a barrier transistor, a selection transistor, a sense circuit, a data resistor, and a control transistor. (See, for example, H. Ito et al., "Pure CMOS One-time Programmable Memory using Gate-Ox Anti-fuse," Proceedings of the IEEE 2004 Custom Integrated Circuits Conference, pp. 469-472.) The e-Fuse element is composed of a pMOS transistor. The barrier transistor is provided to mitigate the influence the high voltage applied to program the e-Fuse element imposes on the peripheral circuits and other elements. The selection transistor is a transistor for selecting the e-Fuse element. The sense circuit is used to read data from the e-Fuse element. The data resistor is configured to hold data. The control resistor is configured to hold control data that is used to program the e-Fuse element.

The e-Fuse element stores data "1" when the high voltage applied between its gate electrode and its source-drain terminal breaks down its gate-insulating film. That is, to store data "1" in the e-Fuse element, a high voltage falling outside the rated range (i.e., a voltage exceeding the maximum rated value) is applied between the gate electrode and the source-drain terminal. Therefore, the transistors other than the e-Fuse element, i.e., the barrier transistor, the selection transistor and the transistors constituting the sense circuit, are high-voltage transistors that operate at voltages higher than the voltages at which the pMOS constituting the e-Fuse element operates. In other words, the e-Fuse element is composed of a pMOS transistor than can operate at a voltage lower than the operating voltages of the barrier transistor, the selection transistor and the transistors constituting the sense circuit.

In some types of conventional OTP memories, the memory cells are integrated, forming a fuse macro (e-Fuse macro). The fuse macro is composed of, for example, a plurality of fuse blocks (e-Fuse blocks), an internal-potential generating circuit, and a fuse-macro control block. The internal-potential generating circuit generates an internal potential required in programming and sensing. Each fuse block is composed of memory cells for 64 bits and a control circuit for controlling these memory cells. The memory cells are connected in series, providing 16 stages. Thus, a fuse macro having a large storage capacity is implemented. The control block of the fuse macro operates in synchronism with a clock signal (CLK). The control block serially is configured to input program data via the data input terminal (SI) in order to write the data, and to output the program data via the output terminal (SO) in order to read the data. The control block input some other control signals, thereby controlling the sensing and reading of the program data stored in the memory cells of each fuse block of the fuse macro.

In such a fuse macro of this configuration, each memory cell includes a sense circuit provided for the e-Fuse element. Hence, the fuse macro makes it easy to design OTP memories of large storage capacity. However, the memory cells have a large size, inevitably increasing the size of the OTP memory.

To solve this problem, an OTP memory of such a type as descried below is now studied. This OTP memory has a plurality of memory cells, each composed of an e-Fuse element, e.g., pMOS transistor, and a selection transistor. These memory cells are arranged in rows and columns, forming a matrix. The gate electrodes of the selection transistors of each row are connected to the one of the paired row-selecting lines provided for the row. The node of the e-Fuse element of any memory cell of the row, which is applied with high voltage, is connected to the other of the paired row-selecting lines. One of the paired row-selecting lines is applied with a voltage that falls within the rated range of the selection transistor for selecting the e-Fuse element. The other of the paired row-selecting lines is applied with a voltage that falls outside the rated range, which is high enough to break down the gate-insulating film of the e-Fuse element. A row decoder controls the application of voltages to the paired row-selecting lines. A data line through which data can be read and written from and into the e-Fuse element is connected to a sense amplifier, a data register and a control register. The sense amplifier, the data register and the control register are provided commonly for the memory cells of each column.

Since the fuse macro is so configured as described above, the area of each memory cell can be reduced. Ultimately, the area of the fuse macro can be decreased. For example, the fuse macro described above has a fuse block, a sense-amplifier block, a register block, a row-decoder block, an internal-potential generating circuit, and control circuits. The fuse block has 32×32 memory cells arranged in 32 rows and 32 columns, forming a memory matrix. The sense-amplifier block has 32 sense amplifiers. The register block has 32 registers. The row-decoder block has 32 row decoders. In the OTP memory having the fuse macro of this configuration, too, the selection transistors, the transistors constituting the sense amplifiers and the transistors constituting the row decoders are transistors that operate at high voltage. The pMOS transistors constituting the c-Fuse elements and the transistors constituting the data registers and control registers are transistors that operate at low voltage.

As specified above, the area of the fuse macro can be reduced since a plurality of memory cells share the same sense amplifier and the like. However, the capacitance of each data line will increase if the integration degree of the OTP memory is raised. The current that flows in each memory cell programmed is not so large because it flows in the gate-insulating film that has been broken down. On the other hand, the gate width of each selection transistor is relatively large in order to supply a large current for programming. If more e-Fuse elements are connected to one sense amplifier, the capacitance of the data line will greatly increase, though the cell current remains the same. The sense time the sense amplifier requires to operate appropriately will inevitably increase.

In many cases, OTP memories of such configuration are generally used in such a manner that the data in the e-Fuse elements is detected when the system is turned on, and is thereafter transferred to a location where the data is required. The time that may be used to turn on the system depends on the type of the system. Nevertheless, the integration degree of the e-Fuse elements will be limited if it increase in proportion to the sense time required to detect the data.

BRIEF SUMMARY OF THE INVENTION

According to a first aspect of the present invention, there is provided a semiconductor memory device that comprises: a memory element which includes a semiconductor element of metal oxide semiconductor (MOS) structure in which data is programmed when an insulating film provided in the semiconductor element is broken down by application of a voltage thereto; a first data line and a second data line which is connected to a sense amplifier; a first selection transistor which is configured to connect the memory element to the first data line in order to program data in the memory element; and a second selection transistor which is configured to connect the memory element to the second data line in order to program data in the memory element and detect the data programmed in the memory element and which has a smaller gate-electrode width smaller than the first selection transistor.

BRIEF DESCRIPTION OF THE SEVERAL VIEWS OF THE DRAWING

FIG. 1 is a circuit diagram showing the configuration of a nonvolatile semiconductor memory device of insulating-film breakdown type (i.e., a fuse macro of an OTP memory), according to a first embodiment of the present invention;

FIG. 5 is a circuit diagram showing the configuration of a nonvolatile semiconductor memory device of insulating-film breakdown type (i.e., a fuse macro of an OTP memory), according to a second embodiment of the present invention;

FIG. 6 is a circuit diagram showing the configuration of a nonvolatile semiconductor memory device of insulating-film breakdown type (i.e., a fuse macro of an OTP memory), according to a third embodiment of the present invention;

DETAILED DESCRIPTION OF THE INVENTION

Figure 2:
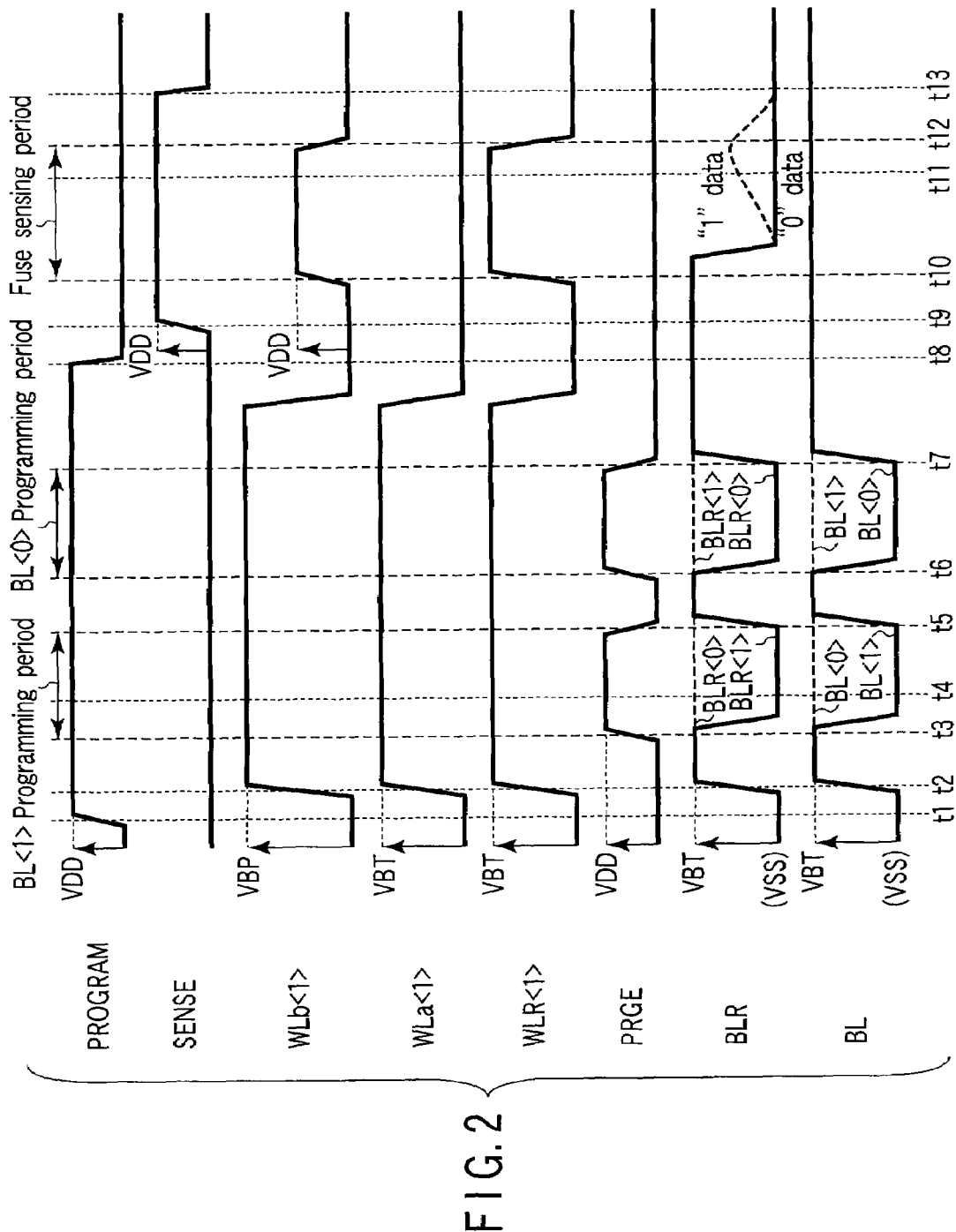
FIG. 2 is a timing chart explaining the operation of the fuse macro shown in FIG. 1.

Embodiments of the present invention will be described with reference to the accompanying drawings. It should be noted that the drawings are schematic ones and the dimension ratios shown therein are different from the actual ones. The dimensions vary from drawing to drawing and so do the ratios of dimensions. The following embodiments are directed to a device and a method for embodying the technical concept of the present invention and the technical concept does not specify the material, shape, structure or configuration of components of the present invention. Various changes and modifications can be made to the technical concept without departing from the scope of the claimed invention.

First Embodiment

FIG. 1 shows the basic configuration of a nonvolatile semiconductor memory device of insulating-film breakdown type, according to the first embodiment of this invention. The present embodiment is the fuse macro of an OTP memory, in which e-Fuse elements (anti-fuse elements of insulating-film breakdown type) have their characteristics are irreversibly changed to store data, and in which the data cannot be rewritten (or new data cannot be written). Note that the fuse macro shown in FIG. 1 has four memory cells and can store four (4) bits.

As FIG. 1 shows, memory cells FC00, FC01, FC10 and FC11, which store four bits in total, are arranged in two rows and two columns, forming a 2×2 matrix. Each memory cell comprises an e-Fuse element 11 and first and second selection transistors (nMOS transistors) 12 and 14. The e-Fuse element 11 is a pMOS transistor. The first and second selection transistors 12 and 14 are provided to select the e-Fuse element 11. The first selection transistor 12 is used in the programming mode. The second selection transistor 14 is used in both the programming mode and the sensing mode. In respect to the column direction, one terminal of the first selection transistor 12 and one terminal of the second selection transistor 14 are connected to a data line 13 (BL<0> or BL<1>) and a data line 15 (BLR<0> or BLR<1>), respectively. The first and second selection transistors 12 and 14 are connected, at the other terminal, to one terminal (gate electrode) of the e-Fuse element 11.

In respect of the row direction, the other terminal (source-drain and well) of the e-Fuse element 11 is connected to a row-selecting line 20 (WLb<0> or WLb<1>) which is applied, in the programming mode, with a high voltage falling outside the rated range and being high enough to break down the gate-insulating film of the e-Fuse element 11. In the sensing mode, the row-selecting line 20 is applied with a voltage falling within the rated range and being not high enough to break down the gate-insulating film of the e-Fuse element 11.

Further, in respect of the row direction, a row-selecting line 21 (WLa<0> or WLa<1>) is connected to the gate electrode of the first selection transistor 12, and a row-selecting line 22 (WLR<0> or WLR<1>) is connected to the gate electrode of the second selection transistor 14. The row-selecting lines 20, 21 and 22 are connected to a corresponding row decoder 31. The row decoder 31 controls the application of voltage to the row-selecting lines 20, 21 and 22.

Two sense amplifiers 32 are provided, each connected to the data lines 13 and 15 in order to read the program data (fuse data) stored in an e-Fuse element 11. Two data registers (Data Regs.) 33 are connected to the sense amplifiers 32, respectively, to hold the data read by the sense amplifiers 32. The data registers 33 are connected to two program control registers (Prog. Cont.) 34, respectively. Each program control register 34 holds control information that is used in the programming mode. The data registers 33 are connected in series. The program control registers 34 are connected in series.

Thus, each OTP memory cell of this embodiment differs from the conventional OTP memory cell in that it has three additional components, i.e., the second selection transistor 14, the data line 15 connected to the transistor 14, and the row-selecting line 22 that controls the second selection transistor 14.

Two data lines 13 and 15 are connected to each of the memory cells FC00, FC01, FC10 and FC11. The sense amplifiers 32 and the registers 33 and 34 therefore somewhat differ in configuration from their counterparts of the conventional OTP memory. However, they function in the same way as their equivalents of their counterparts of the conventional OTP memory. Hence, they will not be described here in detail.

In this embodiment, the first and second selection transistors 12 and 14, the transistors (not shown) provided in the sense amplifiers 32 and the transistors (not shown) provided in the row decoders 31 are high-voltage transistors that have the same second oxide-film (gate-insulating film) thickness. The transistors provided in the e-Fuse elements 11, the transistors (not shown) provided in the data registers 33 and the transistors (not shown) provided in the program control registers 34 are low-voltage transistors that have the same first oxide-film thickness.

The first selection transistors 12 have a greater gate width than the second selection transistors 14. The second selection transistors 14 have a minimum size required. The data lines 15, to which only the second selection transistors 14 having a narrow gate are connected, have a smaller capacitance than the data lines 13 to which the first selection transistors 12 having a broad gate are connected. It follows that the only the second selection transistors 14 are used in the sensing mode. This can shorten the sense time required to detect the program data.

The fuse macro described above has an internal-potential generating circuit (not shown) and a control block (not shown). The internal-potential generating circuit generates an internal potential that is indispensable in the programming mode and the sensing mode.

FIG. 2 explains how the fuse macro configured as described above operates. More specifically, it will be explained how the program data is written into the e-Fuse element 11 of the memory cell FC11 and how the program data is read from the e-Fuse element 11.

How the programming is performed will be first explained. At first, the signal PROGRAM externally supplied to the control block of the fuse macro rises to high (H) level (t1), indicating that the memory has been set to the programming mode. Then, the internal-potential generating circuit generates an internal potential, in preparation for the programming of the memory cells.

When the preparation for the programming is completed, the row decoder 31 selects the row-selecting lines 20 (WLb<1>), 21 (WLa<1>) and 22 (WLR<1>) (t2). In the programming mode, the row-selecting line 20 (WLb<1>) is set to a programming high potential VBP (falling outside the rated range), and the row-selecting lines 21 (WLa<1>) and 22 (WLR<1>) are set to an intermediate potential VBT that is half way between the programming high potential VBP and the power-supply voltage VDD.

Before or after time t2, all data lines 13 (BL<0> and BL<1>) and 15 (BLR<0> and BLR<1>) are charged to the intermediate potential VBT, too.

In order to write data "1" into the e-Fuse element 11 of the memory cell FC 11, that is, to break down the gate-insulating film of the e-Fuse element 11 in accordance with the program data supplied to the data register 33, signal PRGE supplied to the program control registers 34 and instructing data-writing rises to high level at time t3. Then, the sense amplifier 32 decreases the potentials of the data lines 13 (BL<1>) and 15 (BLR<1>) to the ground potential VSS. As a result, the high potential VBP for programming is applied between the gate electrode and source-drain terminal of the e-Fuse element 11. The gate-insulating film of the e-Fuse element 11 is thereby broken down.

To keep holding data "0" in the e-Fuse element 11, that is, not to break down the gate-insulating film of the e-Fuse element 11, the data lines 13 (BL<1>) and 15 (BLR<1>) are maintained at the intermediate potential VBT. Thus, control may be performed not to apply an intense electric field to the gate-insulating film of the e-Fuse element 11.

Actually, however, an intense electric field is applied to the gate-insulating film of the e-Fuse element 11 at time t3. Upon lapse of a certain time, the gate-insulating film is broken down (t4). The intense electric field is kept applied to the gate-insulating film for some time in order to make the current stably flow in the e-Fuse element 11 after the insulating film has been broken down.

At time t5, the programming of the memory cell FC11 selected ends. The data lines 13 (BL<1>) and 15 (BLR<1>) are then charged to the intermediate potential VBT again.

After the memory cell FC11 selected has been programmed and the high voltage VBP for programming has returned to the desired value, the next memory cell FC10 is programmed in the same manner (t6 to t7).

Thus, the memory cells FC11 and FC10 are programmed. Then, the potentials of the row-selecting lines 20 (WLb<1>), 21 (WLa<1>) and 22 (WLR<1>) fall to low (L) level. At the same time, the signal PROGRAM indicating that the memory is in the programming mode is set to L level. Therefore, the internal-potential generating circuit stops operating. The memory comes out of the programming mode (t8).

It will now be described how the fuse data is detected in order to read the program data from the memory cell FC11 that is connected to the row-selecting line 22 (WLR<1>). First, signal SENSE externally supplied and showing that the memory is in the sensing mode rises to H level. Then, the internal-potential generating circuit generates an internal potential, in preparation for the detection of the fuse data (t9).

When the preparation for the detecting the fuse data is completed, the row decoder 31 selects the row-selecting lines 20 (WLb<1>) and 22 (WLR<1>). In this case, the row-selecting lines 21 (WLa<1>) remains at L level and only the row-selecting line 22 (WLR<1>) are set to an intermediate potential VBT, unlike in the programming mode. The row-selecting line 20 (WLb<1>) is set to the power-supply voltage VDD (t10).

After time t10, the sense amplifier 32 decreases the potential of the data line 15 (BLR<1>), to which the cell FC11 is connected, to the ground potential VSS. The data line 15 (BLR<1>) is maintained at the potential VSS by a small-current source. The current flowing in the data line 15 at this time is approximately half the average current that flows before and after the breakdown of the gate-insulating film of the e-Fuse element 11.

While the row-selecting lines 20 (WLb<1>) and 22 (WLR<1>) remain selected, the e-Fuse element 11 of the memory cell FC11 may store data "0." If this is the case, the gate-insulating film of the e-Fuse element 11 has not been broken down. No current therefore flows to the data line 15 (BLR<1>) from the row-selecting line 20 (WLb<1>) through the e-Fuse element 11. Hence, the data line 15 (BLR<1>) holds the ground potential VSS.

The e-Fuse element 11 of the memory cell FC11 may store data "1." In this case, the gate-insulating film of the e-Fuse element 11 has been broken down. Therefore, a current flows into the data line 15 (BLR<1>) from the row-selecting line 20 (WLb<1>) through the e-Fuse element 11. As a result, the potential of the data line 15 (BLR<1>) gradually rises with time.

At time t11 when the data potential accumulated in the e-Fuse element 11 of the memory cell FC11 rises to a sufficiently high level, the sense amplifier 32 is activated. The state of the data line 15 (BLR<1>) is thereby detected. The data representing the state thus detected is stored in the data register 33. Upon completion of this state-detection, the potential of the row-selecting lines 20 (WLb<1>) and 22 (WLR<1>) are lowered to the ground potential VSS (t12).

The memory operates in the sensing mode, similarly on the memory cells FC00, FC01 and FC11. Then, the signal SENSE showing that the memory is in the sensing mode falls to L level. Thus, the internal-potential generating circuit stops operating. Hence, the memory comes out of the sensing mode (t13).

As indicated above, the present embodiment is so configured that the memory cells FC00, FC01, FC10 and FC11 include two selection transistors 12 and 14 each, which are connected to the data lines 13 and 15, respectively. That is, two selection transistors 12 and 14 are used in the programming mode. The selection transistors can therefore have high current-driven ability, whereby the programming current required can be easily acquired. Further, only the selection transistor 14 that has the minimum size required is used in the sensing mode. The data line 15 (BLR<0> and BLR<1>) to which this selection transistor 14 is connected has smaller capacitance that the selection transistor 12, because its gate width is smaller than that of the selection transistor 12. As a result, the data stored in each memory cell can be detected at high speed, and more e-Fuse elements can be connected to each data line. This makes it possible to increase the storage capacity of the fuse macro.

The selection transistors 12 and 14 of each memory cell have a specific layout pattern, which will be described below.

Figure 3:
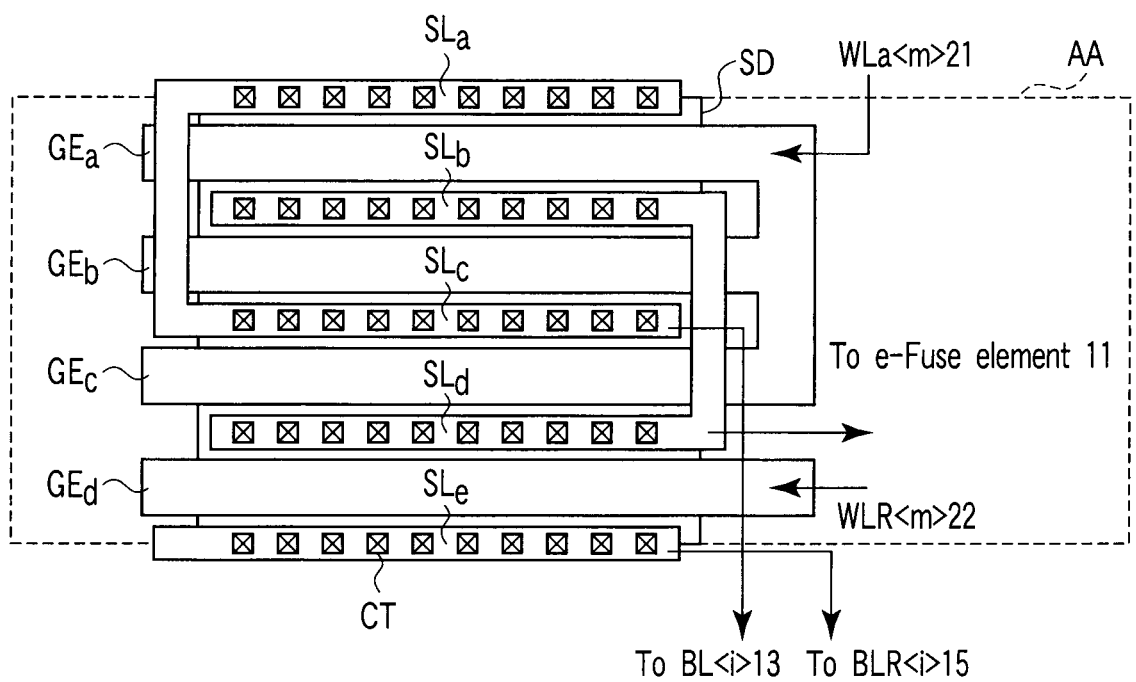
FIG. 3 is a plan view showing the layout pattern of the selection transistor provided in each of the memory cells provided in the fuse macro shown in FIG. 1.

As in most fuse macros of OTP memories, the gate electrodes of the selection transistors 12 and 14 are divided so that the gate electrodes may be arranged within a forming region AA as is shown in FIG. 3. The forming region AA has the smallest possible area in most cases, in conformity with the adjacent areas for the other circuit blocks.

A diffusion layer SD is provided in the forming region AA. On the diffusion layer SD, a gate-insulating film (not shown) is formed. Four gate-electrode parts GEa, GEb, GEc and GEd are arranged, parallel to one another. Of these four gate-electrode parts, three parts GEa, GEb and GEc are connected at one end, forming a gate electrode of the selection transistor 12. The gate electrode is connected to the row-selecting line 21 (WLa<m>). The remaining gate-electrode part, i.e., the part GEd, is provided independently of the other three, and used as the gate electrode of the selection transistor 14. This gate electrode is connected to the row-selecting line 22 (WLR<m>).

Line layers SLa and SLb lie on the sides of the gate-electrode part GEa, respectively; line layers SLb and SLc on the sides of the gate-electrode part GEb, respectively; line layers SLc and SLd on the sides of the gate-electrode part GEc, respectively; and line layers SLd and SLe on the sides of the gate-electrode part GEd, respectively. The line layers SLa, SLb, SLc, SLd and SLe are provided on the above-mentioned diffusion layer SD. The line layers SLa, SLb, SLc, SLd and SLe have a plurality of contacts CT each. The contacts CT of any line layer connect the line layer to the diffusion layer SD. Of the line layers SLa, SLb, SLc, SLd and SLe, the layers SLa and SLc (used as source or drain) are connected to the data line 13 (BL<i>). The line layers SLb and SLd (used as source if the layers SLa and SLc are the drain, or drain if the layers SLa and SLc are the source) are connected to the gate electrode of the e-Fuse element 11. The line layer SLe (used as source or drain) is connected to the data line 15 (BLR<i>).

Since the gate electrodes of the selection transistors 12 and 14 are divided as this layout pattern shows, four gate electrode parts, i.e., parts GEa, GEb, GEc and GEd, can used in the programming mode, and only one gate-electrode part, i.e., part GEd connected to the row-selecting line 22 (WLR<m>), can be used in the sensing mode. The layout pattern is almost the same as the conventional one. Nonetheless, the pattern area is not so much larger than the conventional pattern, notwithstanding the increase in the number of transistors used. Further, the gate electrode of each selection transistor is broadened during the programming mode, in which a large current should flow in the selection transistor. During the sensing mode, in which a large current need not flow in each selection transistor, the gate electrode of the selection transistor is narrowed, thereby reducing the capacitance of the data line.

Note that "m" and "i" are suffixes that represent the addresses of the row-selecting lines 20, 21 and 22 and those of the data lines 13 and 15. In the case shown in FIG. 1, "m" and "i" are "0" and "1," respectively.

If patterns identical to the layout pattern shown in FIG. 3, in which the gate electrodes of the selection transistors 12 and 14 are divided, are arranged, each oriented in the same direction, the use efficiency of area will decrease in most cases. This is because the data lines 13 (BL<i>) and 15 (BLR<i>) are nodes independent of each other.

Figure 4:
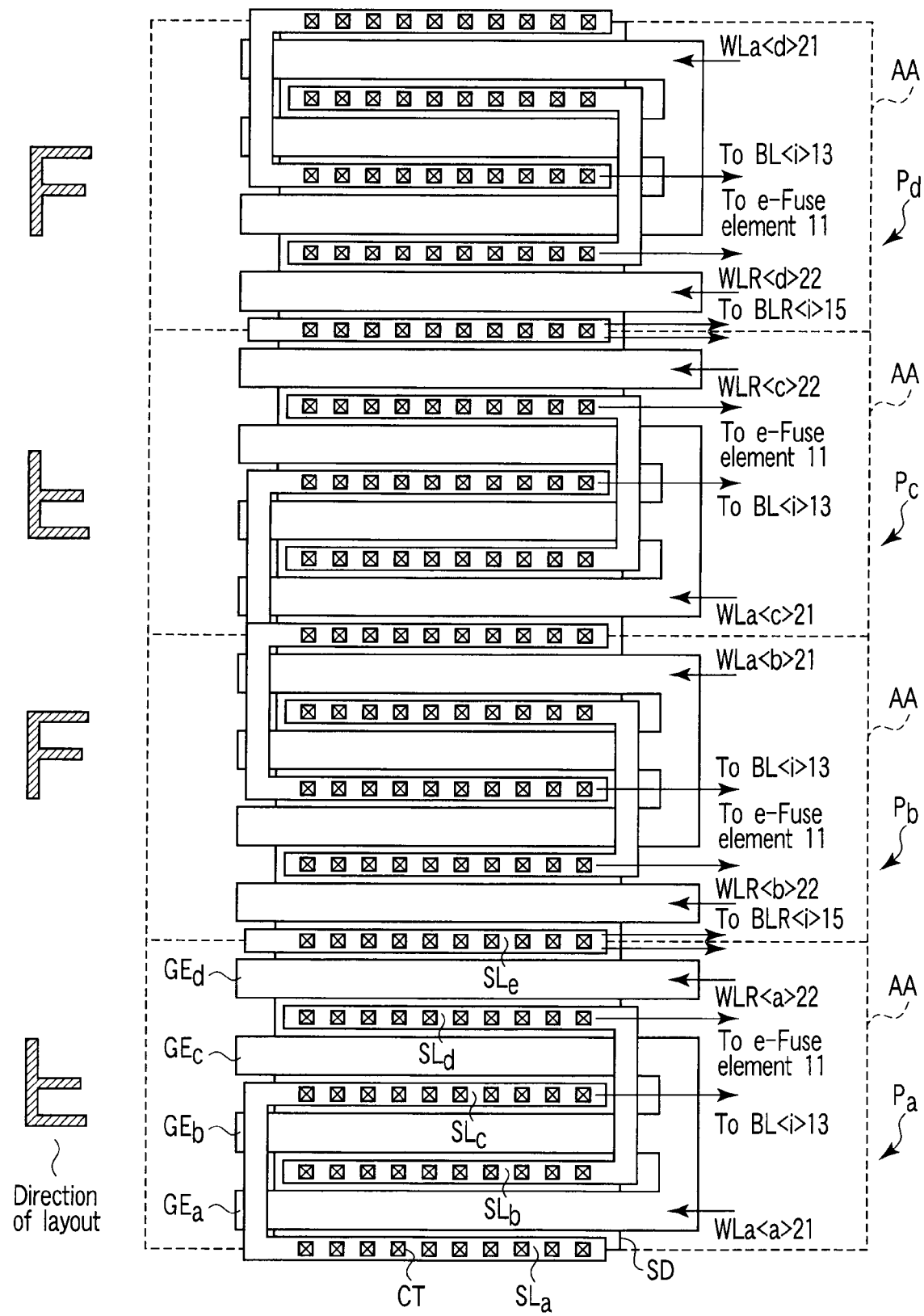
FIG. 4 is a plan view showing the layout pattern of the selection transistor provided in each memory cell of a multi-bit fuse macro.

In any OTP memory of multi-bit configuration, patterns Pa, Pb, . . . are, for example, alternately oriented in one direction and the opposite direction, as is illustrated in FIG. 4. If the patterns are so arranged, the increase in the area each memory cell occupies can be minimized even if the memory cell has a plurality of selection transistors.

The present embodiment is a nonvolatile OTP memory having memory cells, each having an e-Fuse element of insulating-film breakdown type, which has MOS structure. The memory cells share one row decoder and one control circuit such as a sense amplifier, which are used to read and write data from and into the memory cells. Yet, data lines that are used to read data and write data are provided for the memory cells, respectively. Hence, each data line, which is used to detect program data, can have its capacitance reduced. The sense time required to detect the program data can therefore be shortened. As a result, the fuse macro can acquire a large storage capacity.

Second Embodiment

FIG. 5 shows the basic configuration of a nonvolatile semiconductor memory device of insulating-film breakdown type, according to the second embodiment of the present invention. This embodiment differs from the first embodiment in that a first electric-field mitigating transistor is added in each memory cell of the fuse macro of the OTP memory (FIG. 1) and that high potential VBP for programming is directly applied to the source-drain and well of the irreversible e-Fuse element of each memory cell. The components identical to those shown in FIG. 1 are designated by the same reference numbers and will not be described in detail.

As shown in FIG. 5, memory cells FC00', FC01', FC10' and FC11', which store four bits in total, are arranged in two rows and two columns, forming a 2×2 matrix. Each memory cell has an e-Fuse element 11 that is an nMOS transistor. A first electric-field mitigating transistor 41 is connected to one terminal (gate electrode) of the e-Fuse element 11. A first selection transistor (nMOS transistor) 12 and a second selection transistor (nMOS transistor) 14 are connected to the electric-field mitigating transistor 41. The first selection transistor 12 is used in the programming mode only to select the e-Fuse element 11. The second selection transistor 14 is used in both the programming mode and the sensing mode. The gate electrode of the electric-field mitigating transistor 41 is connected to receive intermediate potential VBT that is half way between the programming high potential VBP and the power-supply voltage VDD.

With this configuration, the programming high potential VBP can be applied directly to the other terminal (source-drain and well) of the e-Fuse element 11, in consideration of desired enhancement of operation reliability. Then, sense time required to detect the data stored in the memory cell can be shortened and the fuse macro can acquire a large storage capacity. In addition, the row-selecting line 20 (WLb<m>) connected to the e-Fuse element 11 need not be provided as the first embodiment. This helps to reduce the area for the row decoder 31'.

Third Embodiment

FIG. 6 shows the basic configuration of a nonvolatile semiconductor memory device of insulating-film breakdown type, according to the third embodiment of the present invention. This embodiment differs from the second embodiment in that the e-Fuse element provided in each memory cell is an nMOS transistor. The components identical to those shown in FIG. 5 are designated by the same reference numbers and will not be described in detail.

In the present embodiment, the memory cells FCa00, FCa01, FCa10 and FCa11 comprise an e-Fuse element 11a, a first electric-field mitigating transistor 41, a first selection transistor 12a, a second electric-field mitigating transistor 42, and third and second selection transistors 14a and 14b. The e-Fuse element 11a is a low-voltage nMOS transistor. The first selection transistor 12a is used in the programming mode only. The second and third selection transistors 14a and 14b are used in both the programming mode and the sensing mode. The e-Fuse element 11a and the transistors 12a, 14a, 14b, 41 and 42 have the same first oxide-film thickness (gate-insulating-film thickness).

Row-selecting lines 23 (WL<m>) extend in the row direction, in parallel to each other. The third and second selection transistor 14a and 14b of each memory cell have their gate electrodes connected to the corresponding row-selecting line 23 (WL<m>). The row-selecting lines 23 are connected to row decoders 31a, respectively. Each row decoder 31a controls the application of voltage to the corresponding row-selecting line 23. The voltage applied to the row-selecting line 23 is logic power-supply voltage (VDD).

Data lines 13 (BL<i>) extend in the column direction, in parallel to each other, and are used in the programming mode only. Data lines 15 (BLR<i>) extend in the column direction, in parallel to each other, and are used in both the programming mode and the sensing mode. The selection transistor 14a is connected at one terminal to one data line 13 (BL<i>). The selection transistor 14b is connected at one terminal to one data line 15 (BLR<i>). The other terminal of the selection transistor 14a is connected to the first selection transistor 12a. The other terminal of the selection transistor 14b is connected to the second electric-field mitigating transistor 42.

Programming high potential VBP is applied to one terminal (gate electrode) of the e-Fuse element 11a. The other terminal (source-drain and well) of the e-Fuse element 11a is connected to the source terminal of the first electric-field mitigating transistor 41. The gate electrode of the first electric-field mitigating transistor 41 is connected receive the potential (intermediate potential) VBT for setting the potential of each node. The drain terminal of the first electric-field mitigating transistor 41 is connected to the source terminal of the first selection transistor 12a and the source terminal of the second electric-field mitigating transistor 42. The gate electrode of the first selection transistor 12a is connected to receive signal WE indicating that the memory is in the programming mode. The gate electrode of the second electric-field mitigating transistor 42 is connected to receive the logic power-supply voltage VDD.

The two data lines 13 and 15 are connected to two sense amplifiers 32a, two data registers 33a and two control registers 34a, respectively. The amplifiers 32a, data registers 33a and data registers 34a will not be described in detail, because they are almost identical in function to those used in the other embodiments.

How the memory so configured as described above operates will be explained. In the programming mode for writing program data into the cells, signal WE indicating that cells can be programmed is set to high potential (VDD). Thereafter, potentials VBT and VBP are set to the respective desired values.

In this state, the row decoder 31a selects the row-selecting line 23 connected to the memory cell into which to write the data, setting the line to high potential (VDD). Meanwhile, the sense amplifier 32a set the data lines 13 and 15, to which the memory cell is connected, to low potential (VSS). The memory cell selected is thereby programmed. That is, the program data is stored into the memory cell.

In the sensing mode for reading the program data from the memory cell, the data line 13 dedicated to program reading is held at a predetermined potential, e.g., intermediate potential VBT, and the data line 15 is set to low potential (VSS). At the same time, the signal WE indicating that the memory is in the programming mode is set to low potential (VSS), too.

In this state, the row decoder 31a selects the row-selecting line 23 connected to the memory cell from which to read the data, driving this line. The data line 15 is maintained at low potential if no data is programmed in the e-Fuse element 11a of the memory cell. If data is programmed in the e-Fuse element 11a, high potential VBP is applied, whereby a cell current flows to the data line 15 via the e-Fuse element 11a. The sense amplifier 32a, to which the memory cell is connected, detects the cell current. Hence, whether the data is "0" or "1" can be determined.

Figure 7:
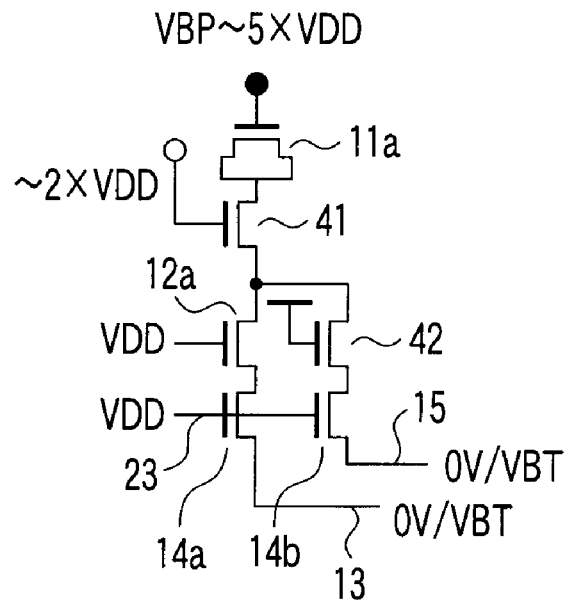
FIG. 7 is a diagram illustrating the potential that each memory cell of the fuse macro shown in FIG. 6 has while it is being programmed.

FIG. 7 illustrates the potential that each memory cell of the fuse macro (FIG. 6) has while being programmed. As FIG. 7 shows, in the programming mode, or while data is being written into the memory cell, the potential VBT applied to the gate electrode of the first electric-field mitigating transistor 41 is the power-supply voltage VDD that is about twice the potential VBT. Thus, the potential applied to the gate electrode of the first selection transistor 12a and the potential applied to the gate electrode of the second electric-field mitigating transistor 42 become equivalent to the power-supply voltage VDD. Further, the potentials applied to the gate electrodes of the second and third selection transistors 14a and 14b become equivalent to the ground potential VSS while the transistors 14a and 14b remain not selected, and become equivalent to the power-supply voltage VDD while the transistors 14a and 14b remain selected. By contrast, the data lines 13 and 15 are set to 0V while remaining selected and to VBT while remaining not selected, though their potentials are controlled in the same way.

Since the potentials are so controlled as described above, the electric fields applied to the transistors 11a, 12a, 14a, 14b and 42 can be maintained within the rated ranges. However, the first electric-field mitigating transistor 41 may be broken down, because it is driven under somewhat severe conditions. Nevertheless, the transistor 41 causes no problem in the process of writing data since it is not used as a switching element at all.

Figure 8:
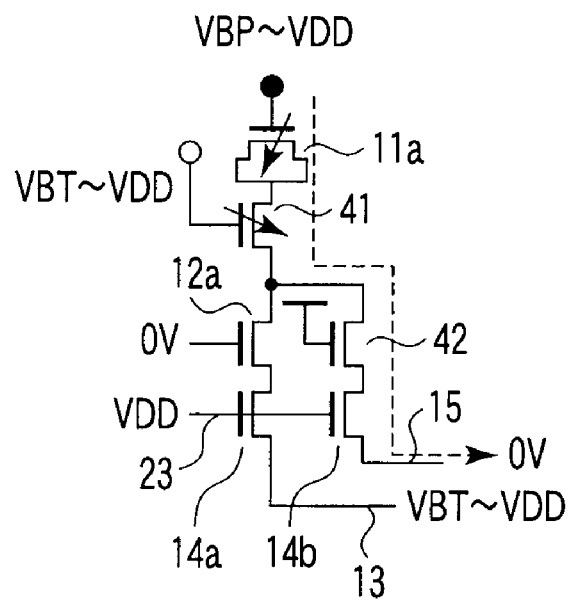
FIG. 8 is a diagram illustrating the potential that each memory cell of the fuse macro shown in FIG. 6 has while the data stored in it is being detected.

FIG. 8 illustrates the potential that each memory cell of the fuse macro (FIG. 6) has while the data stored in it is being detected. As FIG. 8 shows, the in the sensing mode, or while data is being read from the memory cell, the potential VBP applied to the gate electrode of the e-Fuse element 11a and the potential VBT applied to the gate electrode of the first electric-field mitigating transistor 41 are the power-supply voltage VDD. Meanwhile, the ground potential VSS (0V in this case) is applied to the gate electrode of the first selection transistor 12a. Thus, the data is read via the data line 15 only, as is indicated by the broken line in FIG. 8. No voltages higher than the power-supply voltage VDD are applied to the transistors 11a, 12a, 14a, 14b, 41 and 42 in the present embodiment. Hence, the transistors 11a, 12a, 14a, 14b, 41 and 42 would not be broken down while the data is being read.

With this embodiment so configured as described above, too, the data-reading path can be switched as the operating mode of the memory is changed from the programming mode to the sensing mode, and vice versa. As a result, the data can be detected at high speed ad the fuse macro can acquire large storage capacity, as in the first and second embodiments.

Potentials VBP and VBT must indeed be changed, depending on the operating mode of the memory, i.e., programming mode or sensing mode. Nevertheless, all transistors provided in each memory cell can be low-voltage ones.

In the present embodiment, the e-Fuse element of each memory cell is an nMOS transistor. Instead, the e-Fuse element can be a pMOS transistor.

The embodiments described above have a storage capacity of 4 bits. Their storage capacity is not limited to 4 bits, nonetheless.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
    a first data line and a second data line connected to each of a plurality of sense amplifiers; and
    a plurality of memory cells arranged in rows and columns, each of the memory cells including a memory element and first and second selection transistors,
    wherein:
        the memory element includes a semiconductor element of metal oxide semiconductor (MOS) structure, and data is programmed when an insulating film is broken down by application of a voltage;
        the first selection transistor connects the memory element to the first data line in order to program data;
        the second selection transistor connects the memory element to the second data line in order to program data and sense the programmed data, the second selection transistor having a gate-electrode width that is smaller than that of the first selection transistor; and
        each of the memory cells further includes a first electric-field mitigating transistor connected between the memory element and the first and second selection transistors, a third selection transistor connected between the first selection transistor and the first data line, and a second electric-field mitigating transistor connected between the second selection transistor and the first electric-field mitigating transistor.

2. The semiconductor memory device according to claim 1, wherein the memory element is a low-voltage MOS transistor in which the insulating film has a first thickness; and each of the first and second selection transistors is a high-voltage MOS transistor in which an insulating film has a second thickness greater than the first thickness.

3. The semiconductor memory device according to claim 2, wherein the low-voltage MOS transistor is a pMOS transistor.

4. The semiconductor memory device according to claim 2, wherein the high-voltage MOS transistor is an nMOS transistor.

5. The semiconductor memory device according to claim 1, wherein a row decoder applies a voltage to one end of the memory element in order to break down the insulating film.

6. The semiconductor memory device according to claim 1, wherein a voltage is applied directly to one end of memory element in order to break down an insulating film of the memory element.

7. The semiconductor memory device according to claim 1, wherein the memory element, the first selection transistor and the second selection transistor are low-voltage MOS transistors, each having an insulating film of a first thickness.

8. The semiconductor memory device according to claim 7, wherein the low-voltage MOS transistor included in the memory element is a pMOS transistor.

9. The semiconductor memory device according to claim 7, wherein the low-voltage MOS transistor which are the first and second selection transistors are nMOS transistors.

10. The semiconductor memory device according to claim 1, wherein a voltage is applied directly to one end of memory element in order to break down the insulating film of the memory element.

11. The semiconductor memory device according to claim 1, wherein the memory element, the first, second and third selection transistors and the first and second electric-field mitigating transistors are low-voltage MOS transistors, each having an insulating film of a first thickness.

12. The semiconductor memory device according to claim 11, wherein the low-voltage MOS transistors are nMOS transistors.

* * * * *